United States Patent
Hober et al.

(10) Patent No.: US 7,791,224 B2
(45) Date of Patent: Sep. 7, 2010

(54) METHOD AND APPARATUS FOR PROVIDING A VOLTAGE TO A CIRCUIT

(75) Inventors: Peter Hober, Riemerling (DE); Knut Just, Unterschleissheim (DE)

(73) Assignee: Infineon Technologies AG, Neubiberg (DE)

( * ) Notice: Subject to any disclaimer, the term of this patent is extended or adjusted under 35 U.S.C. 154(b) by 185 days.

(21) Appl. No.: 11/586,226

(22) Filed: Oct. 25, 2006

(65) Prior Publication Data

US 2007/0090865 A1 Apr. 26, 2007

(30) Foreign Application Priority Data

Oct. 25, 2005 (DE) .................. 10 2005 051 065

(51) Int. Cl.
*H02B 1/24* (2006.01)
*H01H 7/00* (2006.01)

(52) U.S. Cl. .................. 307/113; 307/139; 307/140; 307/141

(58) Field of Classification Search .................. 307/113, 307/139, 140, 141; 327/554
See application file for complete search history.

(56) References Cited

U.S. PATENT DOCUMENTS

| | | | |
|---|---|---|---|
| 5,859,552 A | 1/1999 | Do et al. | |
| 6,429,708 B2 * | 8/2002 | Asano et al. | 327/170 |
| 6,661,281 B2 | 12/2003 | Nakagawa et al. | |
| 6,876,252 B2 | 4/2005 | Kim et al. | |

FOREIGN PATENT DOCUMENTS

| | | |
|---|---|---|
| DE | 101 20 789 A1 | 11/2002 |
| DE | 102 47 112 B3 | 8/2004 |
| DE | 103 55 509 A1 | 7/2005 |

OTHER PUBLICATIONS

Kim, Suhwan et al., "Minimizing Inductive Noise in System-On-a-Chip with Multiple Power Gating Structures", ISLPED 2003, pp. 635-638, Aug. 2003.

* cited by examiner

*Primary Examiner*—Albert W Paladini
*Assistant Examiner*—Hal I Kaplan
(74) *Attorney, Agent, or Firm*—SpryIP, LLC

(57) ABSTRACT

One embodiment of the invention provides a circuit. The circuit includes a switching unit configured to connect or disconnect a voltage domain to a supply voltage input. The switching unit includes a first switch, a second switch and a third switch. The circuit includes a control signal input configured to receive a switch control signal. The circuit includes a signal distribution unit that is configured to output the switch control signal to the first switch delayed by a first time interval and to output the switch control signal to the second switch and to the third switch delayed by a second time interval.

14 Claims, 3 Drawing Sheets

METHOD AND APPARATUS FOR PROVIDING A VOLTAGE TO A CIRCUIT

REFERENCE TO RELATED APPLICATIONS

This application claims priority to German Patent Application No. 10 2005 051 065.5-33, filed on Oct. 25, 2005.

BACKGROUND

Electrical circuits that are fabricated on semiconductor wafers can include a plurality of voltage domains. A voltage domain is an electrical circuit or circuit block that operates at a specific supply voltage value. The supply voltages for circuits that are used in mobile terminal devices are typically derived from a battery voltage. The supply voltage for a voltage domain is usually connected by means of a switching unit that is arranged outside of a semiconductor device. For this purpose, a voltage source such as a battery that provides the supply voltage is coupled to a supply connection or a supply pin of the semiconductor device via the switching unit. The supply connection is connected to a voltage network within the semiconductor device and forms a voltage domain. The supply connection is connected to or isolated from the voltage source in accordance with a switching state that is selected for the switching unit. If the supply connection is connected to the voltage source, the supply voltage is present at the voltage domain.

In typical systems, a control signal for connecting or disconnecting the supply voltage from a voltage domain is generated within the semiconductor device. In order to control the switching unit by means of the control signal, a control connection or control pin to pass the control signal to the switching unit is provided at the semiconductor device. As a result, at least two connections are needed at the semiconductor device for each voltage domain. The number of connections or pins available for a semiconductor device can be limited as typically many connections are required for other functions. As a result, a disadvantage of this approach is that only a limited number of voltage domains may be able to be provided within the semiconductor device.

It is known to provide a switching unit with respect to each voltage domain within the semiconductor device. The respective switching unit enables the supply voltage to be disconnected from or connected to the voltage domain. The switching unit is typically implemented as a switching element that is large in relation to other circuits that are used in the semiconductor device in order to drive large currents without significant voltage drops at the voltage domains. Furthermore, the switching element is typically located within regions of the semiconductor device or circuit that are not fabricated by means of standard cells. As a result, the length of a supply line between a switching element and a voltage domain may result in a significant voltage drop across the supply line.

In order to avoid the voltage drops, the large switching element is often implemented with multiple switching elements that are relatively smaller in size. The smaller switching elements can be designed and implemented as standard cells. A number of switching elements can be connected in parallel in order to meet the current demands of a voltage domain.

A plurality of voltage domains are usually coupled to voltage supply. When a connection is first made to a first voltage domain, current flows that initially charges the gates and/or other capacitances of circuits within the first voltage domain. This connection operation can initially give rise to a relatively large change in a current $I_{SUP}$ supplied by the voltage supply. The supply lines arranged between the voltage supply and the voltage domain typically have an inductance L. As a result of this inductance, a change in the current $I_{SUP}$ causes a voltage drop $\Delta U_{SUP}$ that occurs along the supply lines in accordance with Equation (1).

$$\Delta U_{SUP} = L \frac{dI_{SUP}}{dt} + RI_{SUP}. \quad (1)$$

A non-reactive resistance R that is present in the supply lines is also taken into account by Equation (1).

In most cases, at least one second voltage domain is connected to a supply line and a same supply voltage is provided to the first and second voltage domains. If the second voltage domain is already in an operating state when the first voltage domain is switched on, the voltage drop $\Delta U_{SUP}$ may be large enough to result in a local malfunction within the second voltage domain. The local malfunction can lead to a global malfunction of the entire semiconductor device. The occurrence of a global malfunction is often times not immediately evident to a user of the semiconductor device.

For these and other reasons, there is a need for the present invention.

SUMMARY

One embodiment of the invention provides a circuit. The circuit includes a switching unit configured to connect or disconnect a voltage domain to a supply voltage input. The switching unit includes a first switch, a second switch and a third switch. The circuit includes a control signal input configured to receive a switch control signal. The circuit includes a signal distribution unit that is configured to output the switch control signal to the first switch delayed by a first time interval and to output the switch control signal to the second switch and to the third switch delayed by a second time interval.

BRIEF DESCRIPTION OF THE DRAWINGS

Embodiments of the invention will be explained in detail in the following text with reference to the accompanying drawings, in which.

DETAILED DESCRIPTION

Figure 1:
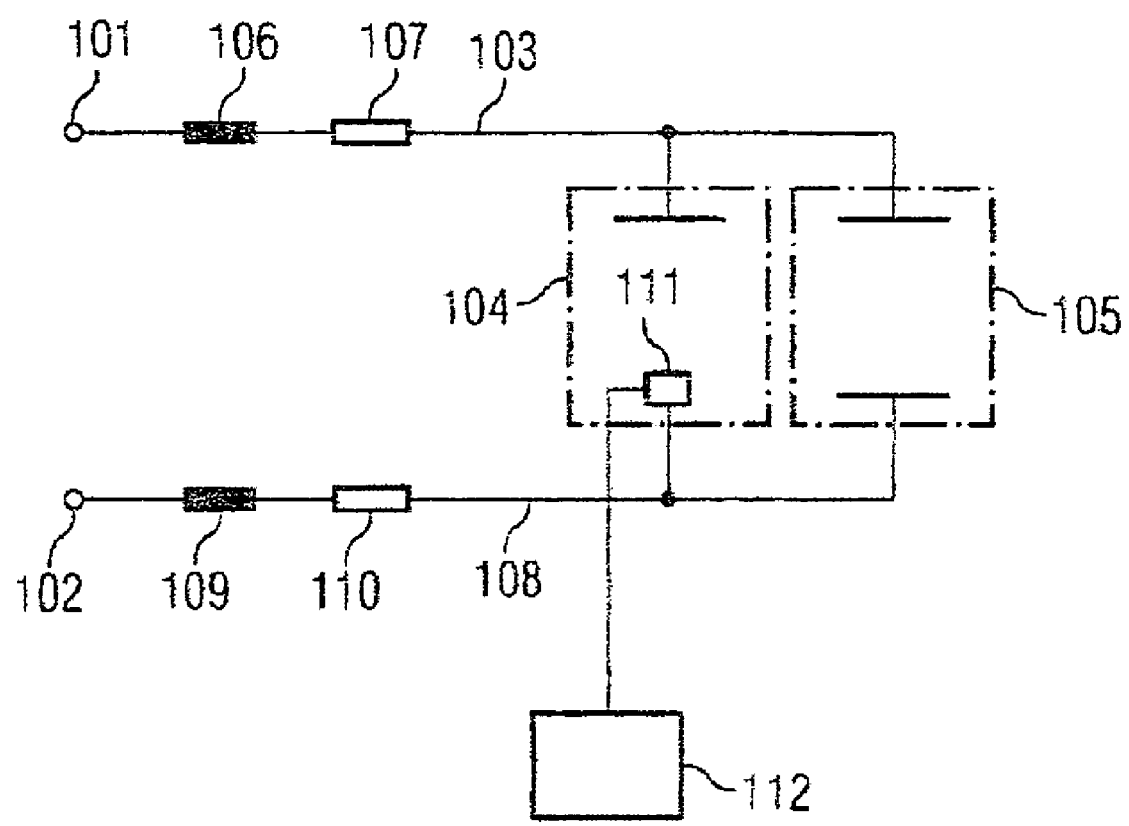
FIG. 1 illustrates one embodiment of a voltage supply of a semiconductor circuit with two voltage domains.

FIG. 1 illustrates one embodiment of a voltage supply of a semiconductor circuit with two voltage domains. The voltage supply has a first input 101, at which a first supply potential, a ground potential, or a reference potential may be provided.

In some embodiments, the supply potential can be provided by a voltage source such as a battery, which is not illustrated in FIG. 1.

The voltage supply has a second input 102, at which a second supply potential may be provided. In one embodiment, the second supply potential is a bias voltage. The first input 101 is coupled via a first supply line 103 to a first voltage domain 104 (illustrated by broken lines) and a second voltage domain 105 (illustrated by broken lines). A supply voltage of the two voltage domains results from the difference between the first supply voltage potential and the second supply voltage potential. On account of physical properties, in various embodiments, the first supply line has a first inherent inductance 106 and a first non-reactive resistance 107. The second input 102 is coupled via a second supply, line 108 to the first voltage domain 104 and the second voltage domain 105. On account of physical properties, in various embodiments, the second supply line 108 has a second inherent inductance 109 and a second non-reactive resistance 110. The second supply line 108 connects to the first voltage domain 104 via a switching unit 111.

In the illustrated embodiment, the second supply voltage potential may be provided to the first voltage domain 104 by means of the switching unit 111. The switching unit 111 is coupled to a control unit 112. In various embodiments, the control unit 112 regulates a switching state of switching unit 111 by means of a control signal. In the event of an operation to connect the supply voltage to the first voltage domain 104, the second supply voltage potential is provided to the first voltage domain 104 by means of the switching unit 111. As a result, a current flows through the first supply line 103 and through the second supply line 108. In various embodiments, these currents charge various elements within the first voltage domain 104 that include, but are not limited to, MOSFET (metal-oxide semiconductor field-effect transistor) gates and/or other intrinsic capacitances. A change in the currents can result in voltage drops in the first supply line 103 on account of the first inherent inductance 106 and in the second supply line 108 on account of the second inherent inductance 109. The induced voltage drops may lead to a decrease in the voltage supplied to the second voltage domain 105, with the result that a malfunction of the semiconductor circuit may occur.

Figure 2:
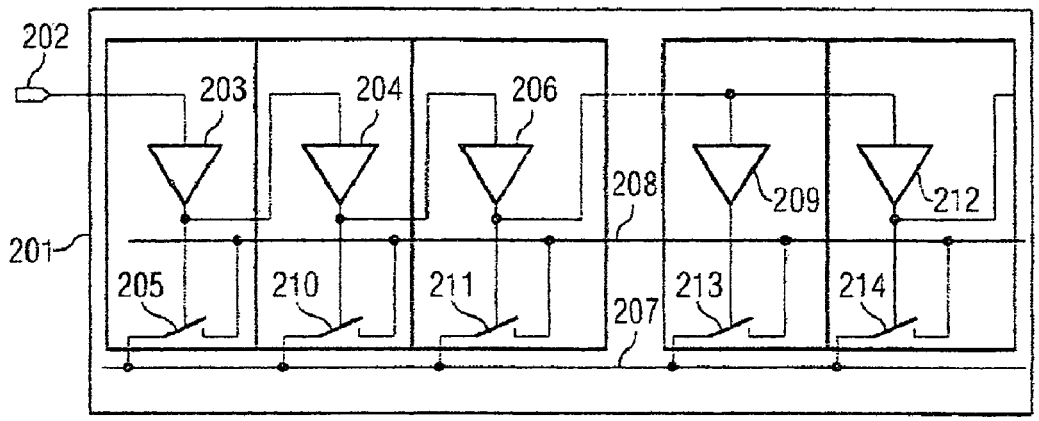
FIG. 2 illustrates a first embodiment of a switching unit in a voltage supply.

FIG. 2 illustrates a first embodiment of a switching unit in a voltage supply. The switching unit 201 has a control signal input 202 that receives a control signal. In some embodiments, the control signal is provided by a control unit as shown in FIG. 1. In the illustrated embodiment, the control input 202 is coupled to an input of a first delay element 203. An output of the first delay element 203 is coupled to a first switching element 205 in order to regulate the switching state of the first switching element 205. The output of the first delay element 203 is coupled to an input of a second delay element 204. The first switching element 205 is coupled between a third supply line 207 and a fourth supply line 208. In one embodiment, if the first switching element 205 is in a closed switching state, equalization current may flow between the third supply line 207 and the fourth supply line 208 until the potential in both supply lines match. In one embodiment, the third supply line 207 may correspond to the second supply line 108 shown in FIG. 1.

In the illustrated embodiment, an output of the second delay element 204 is coupled to the input of a third delay element 206 and is also coupled to a second switching element 210 in order to define the switching state of the second switching element 210. The output of the third delay element 206 is coupled to a third switching element 211 and is also coupled via none or one or more further delay elements to a fourth delay element 209 (illustrated by dashes). An output of the fourth delay element 209 is coupled to a fourth switching element 213. The input of the fourth delay element 209 is coupled to the input of a fifth delay element 212. The output of the fifth delay element 212 is coupled to a sixth switching element 214.

The second switching element 210, the third switching element 211, the fourth switching element 213 and the fifth switching element 215 are each coupled between the third supply line 207 and the fourth supply line 208, so that in a closed switching state each switching element connects the third supply line 207 to the fourth supply line 208. In one embodiment, if one of the switching elements is in a closed switching state, the potentials on the first supply line 207 and the second supply line 208 are the same. In some embodiments, an implementation uses a number of standard cells that each comprise a delay element, an individual element, or both a delay element and an individual element. In some embodiments, the delay elements comprise inverter elements. In the illustrated embodiment, delay elements such as the first delay element 203 and the second delay element 204 include a series circuit that comprises two inverter elements. In this embodiment, the polarity of the control signal is not altered by a delay element. In one embodiment, the switching elements may be realized as n-MOS transistors or p-MOS transistors.

In the illustrated embodiment, the implementation of the switching unit 201 allows for carrying out the connection of a voltage domain progressively. In one embodiment, the control signal closes a switching element having a high voltage potential, that is to say, logic "1". In the event of a switch-on operation, the control signal provided at the control input closes the first switching element 205. After a time delay defined by the second delay element 204, the control signal reaches the control input of the second switching element 210 and closes the second switching element 210. In this embodiment, the first switching element 205 is closed, the second switching element 210 is closed after the first switching element 205 is closed, and the third switching element 211 is closed after the second switching element 210 is closed. The fourth switching element 213 and the fifth switching element 214 are closed simultaneously after the third switching element 211 is closed.

In the illustrated embodiment, at each point in time after the beginning of the switch-on operation, the control signal is present at a defined number of individual elements that are closed. The number of closed switching elements limits the flow of an equalization current between the first supply line 207 and the second supply line 208. In this embodiment, a temporal change in the switch-on current is limited. The number of closed switching elements defines the maximum switch-on current by the sum of the saturation currents of the closed switching elements. In other words, only a current driven by the closed switching elements will flow. The temporal sequence of the closing of the switching elements likewise limits the maximum change in the switch-on current over time. As a consequence, an excessively large voltage drop is prevented from arising in the leads of the voltage supply.

In one embodiment, a rapid connection or disconnection of the voltage domain to the voltage supply can occur. In this embodiment, frequent disconnection and connection of the voltage supply may provide for an energy savings potential in the case of the supply voltage. The energy savings potential can be particularly advantageous for battery-powered systems, such as portable computers, mobile phones or mobile terminal devices.

Figure 3:
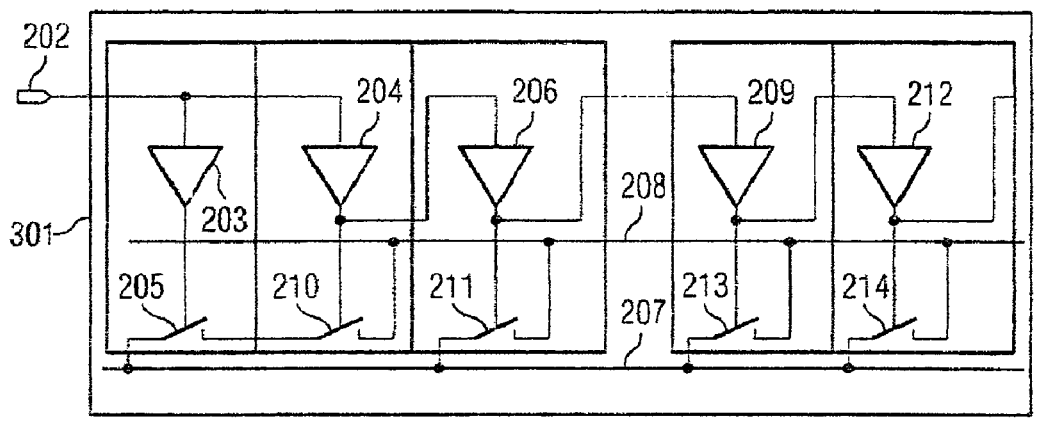
FIG. 3 illustrates a second embodiment of a switching unit in a voltage supply.

FIG. 3 illustrates a second embodiment of a switching unit in a voltage supply. The same reference symbols or numerals are used for similar elements of the various embodiments. The switching unit 301 includes a control input 202 to receive a control signal. In one embodiment, the control signal may be provided by a control unit as shown in FIG. 1. In the illustrated embodiment, the control input 202 is coupled to an input of a first delay element 203. The control input is likewise coupled to the input of a second delay element 204. An output of the first delay element 203 is coupled to a first switching element 205. The output of the second delay element 204 is coupled to a second switching element 210. The output of the second delay element 204 is coupled to the input of a third delay element 206. The first switching element 205 and the second switching element 210 are coupled in series between a third supply line 207 and a fourth supply line 208. If the first switching element 205 and the second switching element 210 are in a closed switching state, an equalization current flows between the third supply line 207 and the fourth supply line 208 until the respective potentials are equal. The current flowing through the first switching element 205 and the second switching element 210 is limited by the respective saturation currents of the first switching element 205 and the second switching element 210. In one embodiment, the higher resistance that results from the first switching element 205 and the second switching element 210 being coupled in series results in a reduced current flowing through switching elements 205 and 210.

In the illustrated embodiment, an output of the third delay element 206 is coupled to a third switching element 211. The output of the third delay element 206 is likewise coupled via none or one or more further delay elements to a fourth delay element 209 (illustrated by dashes). An output of the fourth delay element 209 is coupled to a fourth switching element 213 and to the input of a fifth delay element 212. An output of the fifth delay element 212 is coupled to a sixth switching element 214.

In the illustrated embodiment, the third switching element 211, the fourth switching element 213 and the fifth switching element 214 are arranged between the third supply line 207 and the fourth supply line 208, so that each switching element in a closed switching state connects the third supply line 207 to the fourth supply line 208. If one of the switching elements is in a closed switching state, the potentials on the first supply line 207 and the second supply line 208 will equalize. In one embodiment, the switching elements may be implemented as n-MOS transistors or p-MOS transistors.

In the illustrated embodiment, a switch-on operation takes place in a manner analogous to that in FIG. 2. In this embodiment, the first switching element 205 and the second switching element 210 are closed simultaneously. The current that flows through the series circuit comprising the two switching elements is lower than a current that would flow through a single switching element, such as, for example, the third switching element 211, the fourth switching element 213 or the fifth switching element 214. In this embodiment, the lower initial current limits a temporal change in the current flow. In this embodiment, the limited change in the current flow enables the voltage domain that is coupled to the switching unit to be switched on as rapidly as possible while ensuring the functioning of the remaining circuit domains. In various embodiments, the switching elements illustrated in FIG. 3 can be implemented using standard cells.

Figure 4:
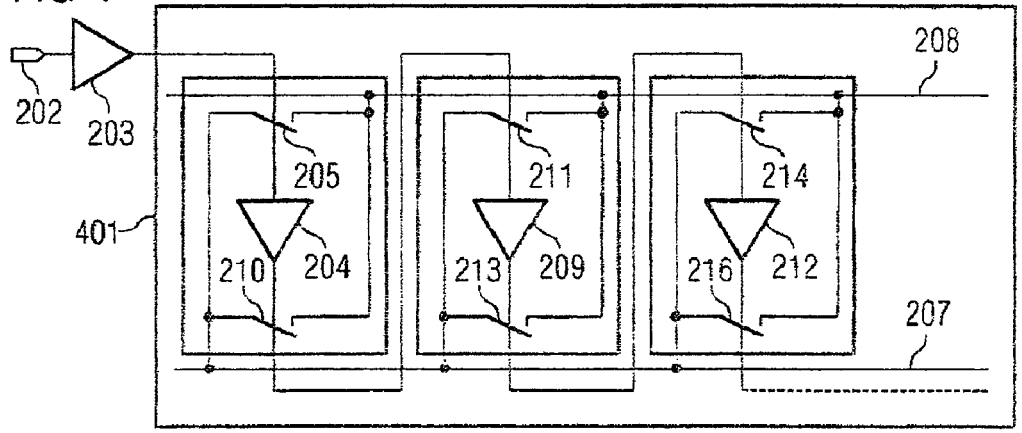
FIG. 4 illustrates a third embodiment of a switching unit in a voltage supply.

FIG. 4 illustrates a third embodiment of a switching unit in a voltage supply. The same reference symbols or numerals are used for similar elements of the various embodiments. The switching unit 401 shown in FIG. 4 has a control input 202 to receive a control signal. In various embodiments, the control signal may be provided, as in FIG. 2, by means of a control unit as shown in FIG. 1. The control input 202 is coupled to an input of a first delay element 203, and an output of the first delay element 203 is coupled to an input of a second delay element 204. In addition, the output of the first delay element 203 is coupled to a first switching element 205. As a result, the first switching element can be put into a closed switching state or an open switching state by means of the control signal.

In the illustrated embodiment, an output of the second delay element 204 is coupled to a second switching element 210, a third switching element 211 and to an input of a fourth delay element 209. An output of the fourth delay element 209 is coupled to a fourth switching element 213, to a fifth switching element 214 and the input of a fifth delay element 212. An output of the fifth delay element 212 is coupled to a sixth switching element 216.

In the illustrated embodiment, the first switching element 205, the second switching element 210, the third switching element 211, the fourth switching element 213, the fifth switching element 214 and the sixth switching element 216 are each coupled between a third supply line 207 and a fourth supply line 208. Each of the switching elements when in a closed switching state electrically couples the third supply line 207 to the fourth supply line 208. In one embodiment, this enables the potential on the supply lines to be equalized In the illustrated embodiment, a switch-on operation of the switching unit shown in FIG. 4 is effected in such a way that the first switching element 205 is closed first. As a result, an electrical current flows between the third supply line 207 and the fourth supply line 208 as a result of a potential difference. The current is restricted by the saturation current or the internal resistance of the first switching element 205. If the first switching element 205 is embodied as field effect transistor, this restriction also results from a channel length or channel width of a gate region of the field-effect transistor.

In the illustrated embodiment, the second delay element 204 delays the propagation time of the control signal by a predetermined time interval, after which the second switching element 210 is closed. In one embodiment, the second switching element 210 drives a higher current for equalizing the potentials on the third supply line 207 and the fourth supply line 208. In one embodiment, the second switching element 210 has a higher saturation current or a lower internal resistance as compared to the first switching element 205.

In the illustrated embodiment, the third switching element 211 and the second switching element 210 are closed simultaneously. The fourth switching element 213 is subsequently closed after a time interval determined by the third delay element 209.

The fifth switching element 214 is closed together with the fourth switching element 213. The sixth switching element 216 is subsequently closed after a time interval determined by the fourth delay element 209.

In the illustrated embodiment, the switching elements are arranged in pairs. Thus, the first switching element 205 is arranged spatially in proximity to the second switching element 210. The third switching element 211 is arranged spatially in proximity to the fourth switching element 213. The fifth switching element 214 is arranged spatially in proximity to the sixth switching element 216. Each switching element pair includes one switching element driving a low current and one switching element driving a higher current. The pairs may be distributed spatially over the voltage domain. In this embodiment, a specific switch on operation may be applied. In one embodiment, a switching element that can drive a low current for pre-charging an environment is closed first, and a switching element that drives a higher current is closed later for faster charging.

In various embodiments, to accelerate the overall charging operation, a "weaker" switching element of a different switching element pair, which can already pre-charge a different environment in the voltage domain, is already closed with the "stronger" switching element. If the second switching element 210 and the first switching element 205 are implemented as field effect transistors, then, by way of example, the channel width of the second switching element 210 is greater than the channel width of the first switching element 205.

Figure 5:
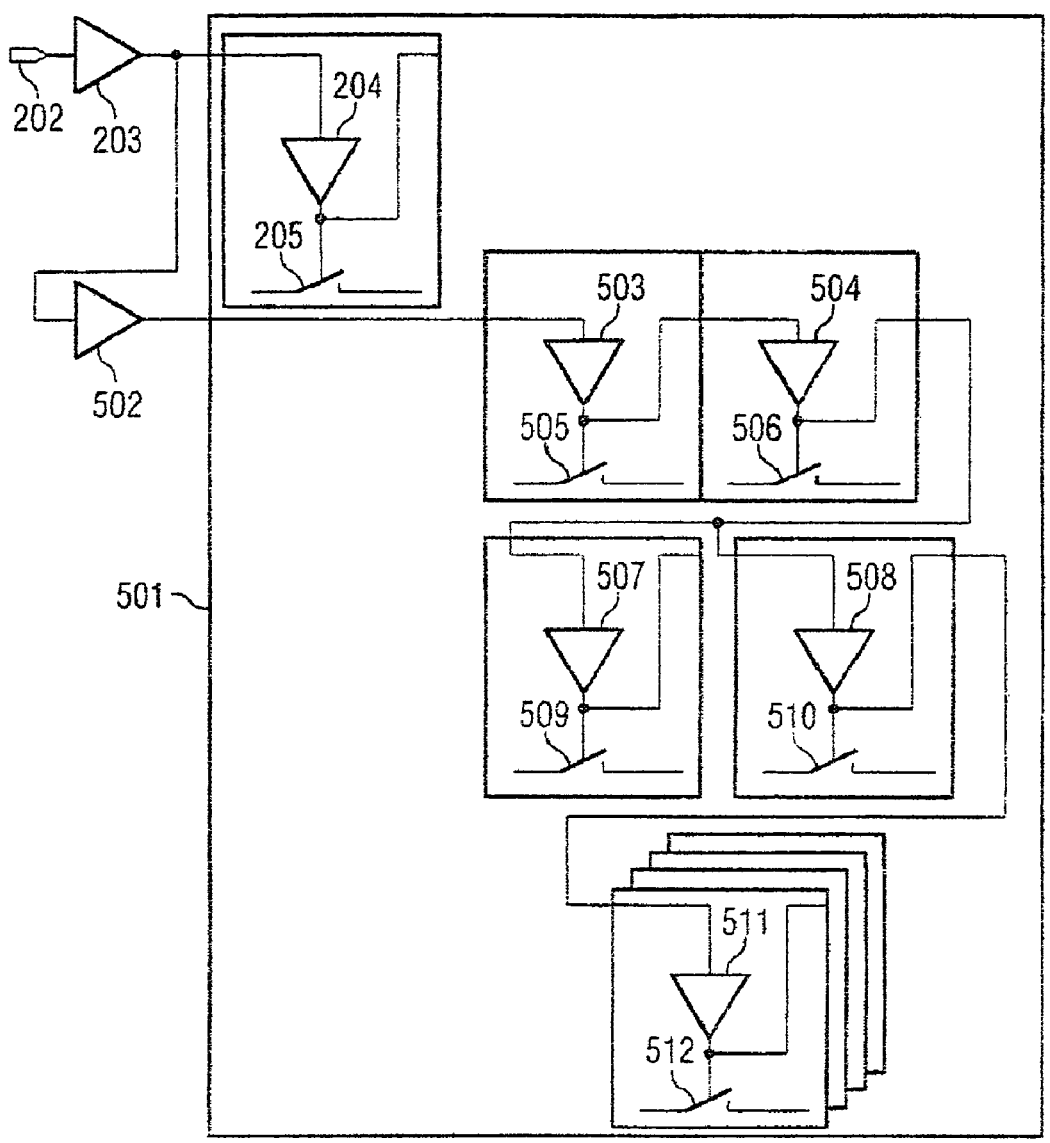
FIG. 5 illustrates a fourth embodiment of a switching unit in a voltage supply.

FIG. 5 illustrates a fourth embodiment of a switching unit in a voltage supply. The same reference symbols or numerals are used for similar elements of the various embodiments. In the illustrated embodiment, a switching unit 501 has a control signal input 202 suitable for receiving a control signal. In one embodiment, the control input is the same as in FIG. 2, FIG. 3 or FIG. 4. In the illustrated embodiment, the control signal is provided for example by a control unit as illustrated in FIG. 1. The control input 202 is coupled to an input of a first delay element 203. An output of the first delay element 203 is coupled to an input of a second delay element 204 and the input of a seventh delay element 502. The output of the second delay element 204 is coupled to a first switching element 205. An output of the seventh delay element 502 is coupled to an input of an eight delay element 503. An output of the eighth delay element 503 is coupled to an input of a ninth delay element 504. The output of the eighth delay element 503 is additionally coupled to a seventh switching element 505. The output of the ninth delay element 504 is coupled to an eighth switching element 506. The output of the ninth delay element 504 is coupled to the input of a tenth delay element 507 and the input of an eleventh delay element 508. The output of the eleventh delay element 508 is coupled to an input of a twelfth delay element 511 and also to further delay elements. The output of the tenth delay element 507 is coupled to a ninth switching element 509. The output of the eleventh delay element 508 is coupled to a tenth switching element 510. The output of the twelfth delay element 511 is coupled to an eleventh switching element 512. Each of the outputs of the second delay element 204, of the eighth delay element 503, of the ninth delay element 504, of the tenth delay element 507, of the eleventh delay element 508 and of the twelfth delay element 511 may in be the starting point for a further "daisy chain".

In the event of a switch-on operation of the switching unit according to FIG. 5, the first switching element 205 is closed in order to pre-charge the voltage domain. The seventh switching element 505 and the eighth switching element 506 are subsequently closed progressively. The ninth switching element 509 and simultaneously the tenth switching element 510 are subsequently closed in parallel. Afterwards, the eleventh switching element 512 and possibly a series of further switching elements over the voltage domain are closed. This enables a single switching element, namely the first switching element 205, to be closed in the event of a switch-on operation. The seventh switching element 505 is subsequently closed, the embodiment of which switching element may be such that it has more current, that is to say a higher saturation current than the first switching element 205. The eighth switching element 506, which is subsequently closed, is also able to drive a higher current than the first switching element 505. In one embodiment it is designed in the same way as the seventh switching element 505. The next two switching elements are subsequently closed simultaneously, so that in total a higher current than previously can be driven. In the concluding part, a plurality of switching elements are closed in parallel, so that the charging operation overall proceeds more rapidly than if the switching elements are closed progressively. It is simultaneously ensured that precisely during charging, the current required for charging of the voltage domain is limited by the saturation currents of the switching elements.

Figure 6:
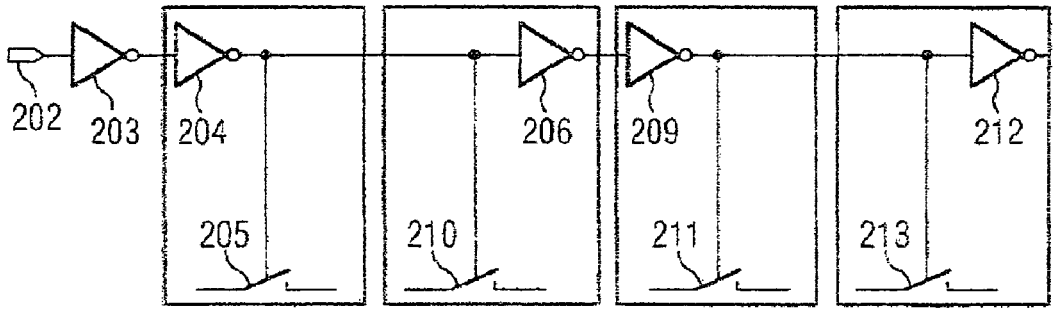
FIG. 6 illustrates a fifth embodiment of a switching unit in a voltage supply.

FIG. 6 illustrates a fifth embodiment of a switching unit in a voltage supply. The same reference symbols or numerals are used for similar elements of the various embodiments. In the illustrated embodiment, a switching unit has a control signal input 202 that is suitable for receiving a control signal, in various embodiments, such as is illustrated in FIG. 2, FIG. 3, FIG. 4 or FIG. 5. The control signal is provided for example by means of a control unit as provided in FIG. 1.

In the illustrated embodiment, the control input 202 is coupled to an input of a first delay element 203. An output of the first delay element 203 is coupled to a first switching element 205 and to a second switching element 210. Furthermore, the output of the first delay element 203 is coupled to an input of a third delay element 206. An output of the third delay element 206 is coupled to an input of a fourth delay element 209. An output of the fourth delay element 209 is coupled to a third switching element 211 and to a fourth switching element 213. Furthermore, the output of the fourth delay element 209 is coupled to an input of a fifth delay element 212. This circuitry chain can be correspondingly continued, so that further switching elements are provided, to which the control signal is fed via further delay elements. In this case, it proves to be advantageous for the delay elements to be embodied as inverter elements, as is the case in this exemplary embodiment. A very compact configuration of the circuitry chain is obtained as a result.

In the event of a switch-on operation for the switching unit in accordance with FIG. 6, first of all the first switching element 205 and the second switching element 210 are closed. The third switching element 211 and the fourth switching element 213 are subsequently closed. In this case, by way of example, the first switching element 205 and the second switching element 210 are designed in such a way that they drive a small current. By contrast, the third switching element 211 and the fourth switching element 213 may be set up in such a way that they drive a higher current. The switching elements are distributed over a voltage domain, for example, so that first of all a current for pre-charging the voltage domain is switched on, which current turns out to be smaller than the current required for the connection of the voltage domain.

It is advantageous that the control signal is passed to the switching elements via delay elements the delay elements likewise being supplied by the supply voltage. If the supply voltage drops to an excessively great extent as a result of an excessively rapid switch-on operation, a sufficient signal is not provided at the outputs of the delay elements, so that the control signal is not forwarded. Additional switching elements in the switch chain (daisy chain) are not closed. In one embodiment, this ensures that the voltage domain is charged rapidly overall without a dip in the supply voltage on the voltage supply and without causing a malfunction of the entire integrated semiconductor circuit in which the voltage domain is situated.

In one embodiment, the daisy chain is having a tree structure, i.e. having different branches. By way of example, each branch may be designed equally. The branches may as well include different structures as e.g. shown in the FIG. 6.

In one embodiment the switching elements may be distributed over the voltage domain, so that a local charging of circuit elements takes place prior to a comprehensive connection of the supply voltage In one embodiment, the switching elements are arranged in a manner distributed uniformly over regions of the integrated semiconductor circuit in which is located at least one voltage domain whose voltage supply is to be switched. It is thereby possible, in the event of a connection operation, to effect rapid and uniform charging of the circuit elements in the voltage domain.

In one embodiment the switching unit is located within the voltage domain. Supply lines between the switching unit and the voltage domain can thereby be made short. Unnecessary interference effects due to inductances and capacitances in the supply lines can be prevented in this way.

In one embodiment, the first individual switching element, the second individual switching element and the third individual switching element are arranged in a manner distributed uniformly over regions of the integrated semiconductor circuit in which is located at least one voltage domain whose voltage supply is to be switched. It is thereby possible, in the event of a connection operation, to effect rapid and uniform charging of the circuit elements in the voltage domain.

The embodiments shown may be combined as desired and/or according to the conditions of a voltage domain. In particular, different branches of the daisy chain may be provided.

What is claimed is:

1. An integrated semiconductor circuitry comprising
a voltage domain comprising a circuit block of the integrated semiconductor circuitry;
a switching unit to connect or disconnect the voltage domain to a supply voltage input comprising a first switch, a second switch, and a third switch, the supply voltage to enable the voltage domain to electrically function;
a control signal input to receive a switch control signal; and
a signal distribution unit coupled between the control signal input and the switching unit,
the signal distribution unit being arranged to output the switch control signal to the first switch delayed by a first time interval and to output the switch control signal to the second switch and to the third switch delayed by a second time interval different from the first time interval,
wherein after the first time interval, the switch control signal is to close the first switch, the first switch to thereby output a first current to the voltage domain, and after the second time interval, the switch control signal is to close the second and third switches, the second and third switches to thereby output a second current being greater than the first current.

2. The integrated semiconductor circuit according to claim 1,
with the supply voltage input being coupled to a voltage source.

3. The integrated semiconductor circuit according to claim 1,
with the first switch having a first resistance value in a closed switching state and the second switch having a second resistance value different from the first resistance value, in a closed switching state.

4. The integrated semiconductor circuit according to claim 3,
with the first resistance value being greater than the second resistance value.

5. The integrated semiconductor circuit according to claim 3,
with the third switch having the second resistance value in a closed switching state.

6. The integrated semiconductor circuit according to claim 1,
comprising at least one voltage domain coupled to the switching unit.

7. The integrated semiconductor circuit according to claim 1,
with the switching unit being arranged within the voltage domain.

8. An apparatus comprising:
a circuit domain to receive a supply voltage that enables the circuit domain to electrically function;
a first switch, a second switch, and a third switch to connect or disconnect the circuitry domain to a supply voltage input;
an input to receive a control signal; and
a signal delay unit coupled between the input and the first switch, the second switch and the third switch,
the signal delay unit comprising delay elements to forward the control signal to the first switch delayed by a first interval and to forward the switch control signal to the second switch and to the third switch delayed by a second interval different from the first interval,
wherein after the first interval, the control signal is to close the first switch, the first switch to thereby output a first current to the voltage domain, and after the second interval, the control signal is to close the second and third switches, the second and third switches to thereby output a second current being greater than the first current.

9. The apparatus according to claim 8,
with the first switch being coupled in parallel to the second switch.

10. The apparatus according to claim 8,
with the first switch having a first resistance value in a closed switching state and the second switch having a second resistance value different from the first resistance value, in a closed switching state.

11. The apparatus according to claim 10,
with the first resistance value being greater than the second resistance value.

12. The apparatus according to claim 8,
with the first switch having a first saturation current and the second switch having a second saturation current different from the first saturation current.

13. The apparatus according to claim 12,
with the first saturation current being greater than the second saturation current.

14. The apparatus according to claim 10,
with the third switch having the second resistance value in a closed switching state.

* * * * *